United States Patent [19]

Taylor, Sr.

[11] Patent Number: 4,711,197

[45] Date of Patent: Dec. 8, 1987

[54] GAS SCAVENGER

[75] Inventor: Jerry A. Taylor, Sr., Corona, Calif.

[73] Assignee: Thermco Systems, Inc., Orange, Calif.

[21] Appl. No.: 919,736

[22] Filed: Oct. 16, 1986

[51] Int. Cl.$^4$ ............................................. C23C 16/00
[52] U.S. Cl. ................................................. 118/715
[58] Field of Search ............ 118/715, 719, 729, 733; 148/DIG. 6; 422/181, 218; 55/445, 467; 34/231

[56] References Cited

U.S. PATENT DOCUMENTS 3,920,404 11/1975 Gandhi et al. .................... 422/181
3,960,509 6/1976 Abriany ............................ 422/181
4,094,644 6/1978 Wagner ............................ 422/181

Primary Examiner—John E. Kittle
Assistant Examiner—Terry J. Owens
Attorney, Agent, or Firm—John K. Williamson

[57] ABSTRACT

A gas scavenger unit educts gases away from semiconductor wafers as they are withdrawn through a plenum in the scavenger from their processing chamber into the atmosphere. The scavenger has a peripheral wall which generally defines a plenum having two open ends. The one end of the plenum communicates with the processing chamber and the other end communicates with the atmosphere. An exhaust port in the peripheral wall communicates with a house gas exhaust system. The plenum is divided into two chambers by an apertured interior wall. The wafers travel through the first chamber, and the second chamber communicates with the house gas exhaust system. The apertures in the interior wall are disposed about the wafer travel path so that gases from the processing chamber and/or the atmosphere are educted into the house exhaust system without flowing across the wafers.

8 Claims, 4 Drawing Figures

GAS SCAVENGER

BACKGROUND OF THE INVENTION

1. Field of the Invention

This invention relates to a gas scavenger for educting gas away from semiconductor wafers as they are withdrawn from a processing chamber in a vertical or horizontal chemical vapor deposition furnace after being treated.

2. Description of the Related Art

In wafer fabrication processes such as diffusion, deposition, oxidation and annealing, semiconductor wafers in boats are treated in horizontal tubular chambers encircled with electrical heating elements with heated, toxic, flammable or corrosive gases. Gas scavengers are used at the exhaust ends of the tubes for educting these gases into the house exhaust systems. FIG. 1 is a plan sectional view of a typical hot wall process tube 24 in a furnace 23 and a scavenger 30 fastened to its exhaust end 26. Gas flows into the source end 25 of the process tube 24, out through the exhaust end 26 into the scavenger 30 and then into an exhaust port 32 connected to the house exhaust system 33. Also, air flows into the scavenger 30 through its usually uncovered outboard end 34 and then through the port 32 into the house exhaust system 33. Such scavengers are typically about twelve to fifteen inches square and about twelve to eighteen inches deep.

After processing and while the process or purge gas is flowing, the wafer-ladened boats 22 are withdrawn by boat loaders (not shown) from the process tube 24 through its exhaust end 26 into the scavenger 30 and then to a loading/unloading station in the air (not shown). As FIG. 1 illustrates, the design of such scavengers causes turbulent gas currents 28 in the scavenger to flow through the wafers 20 as a boat 22 is withdrawn from the process tube 24. This causes particulates trapped in the scavenger 30 to become entrained in the gas along with the entrained particles from the process tube 24 and to deposit on the surfaces of the wafers 20 as the gas flows through the boat. In addition, air currents 36 are drawn across the boat 22 path of travel as well.

SUMMARY OF THE INVENTION

In the gas scavenger of the present invention, the gas and air flow through a scavenger without passing through the boat travel path. In the improved scavenger, the gas and air flow away from the central portion of the plenum of a scavenger toward its peripheral wall and then to the house exhaust system 33. In addition, the improved gas scavenger more efficiently draws the process and purge gases into the house exhaust system 33 so that the atmosphere around the process tube remains safe and the tube remains on-stream.

The improved gas scavenger generally has a peripheral wall defining a plenum having opposite ends, where the one end is in gas flow communication with the processing chamber of a vertical or horizontal furnace and the other end is in gas flow communication with the air. Also, the outer wall has a gas exhaust port in gas flow communication with a house gas exhaust system. An interior wall divides the plenum into a first chamber through which the wafers travel and a second chamber in gas flow communication with the gas exhaust port in the outer wall. The interior wall importantly has apertures about the path of wafer travel for educting the gases and air which flow in the first chamber into the second chamber. Preferably, the apertures substantially surround the path of wafer travel so that there are practically no air currents which flow across the surface of the wafers. Most preferably, no air currents flow across the surface of the wafers. Such a scavenger is described in detail below. As will be described, it is preferred to seal the ends of the second chamber defined by the outer wall and the interior wall so that there is no gas short circuiting at the ends of the plenum. Also, the scavenger preferably has a damper in operative relation with the apertured inner wall for controlling the gas flow volume and velocity without changing the air flow pattern.

Other details, objects and advantages of the invention will become apparent as the following description of a presently preferred embodiment thereof proceeds.

BRIEF DESCRIPTION OF THE DRAWINGS

In the accompanying drawings.

DESCRIPTION OF THE PREFERRED EMBODIMENTS

Figure 1:
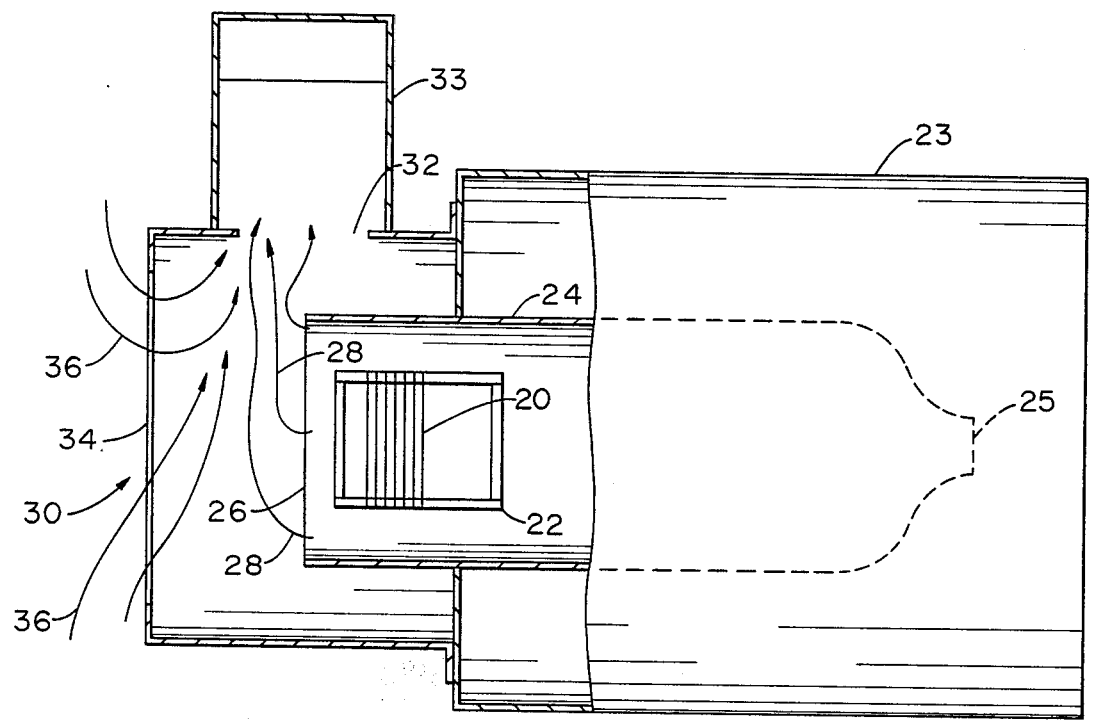
FIG. 1 (as indicated above) is a sectional plan view of a conventional scavenger.
Figure 2:
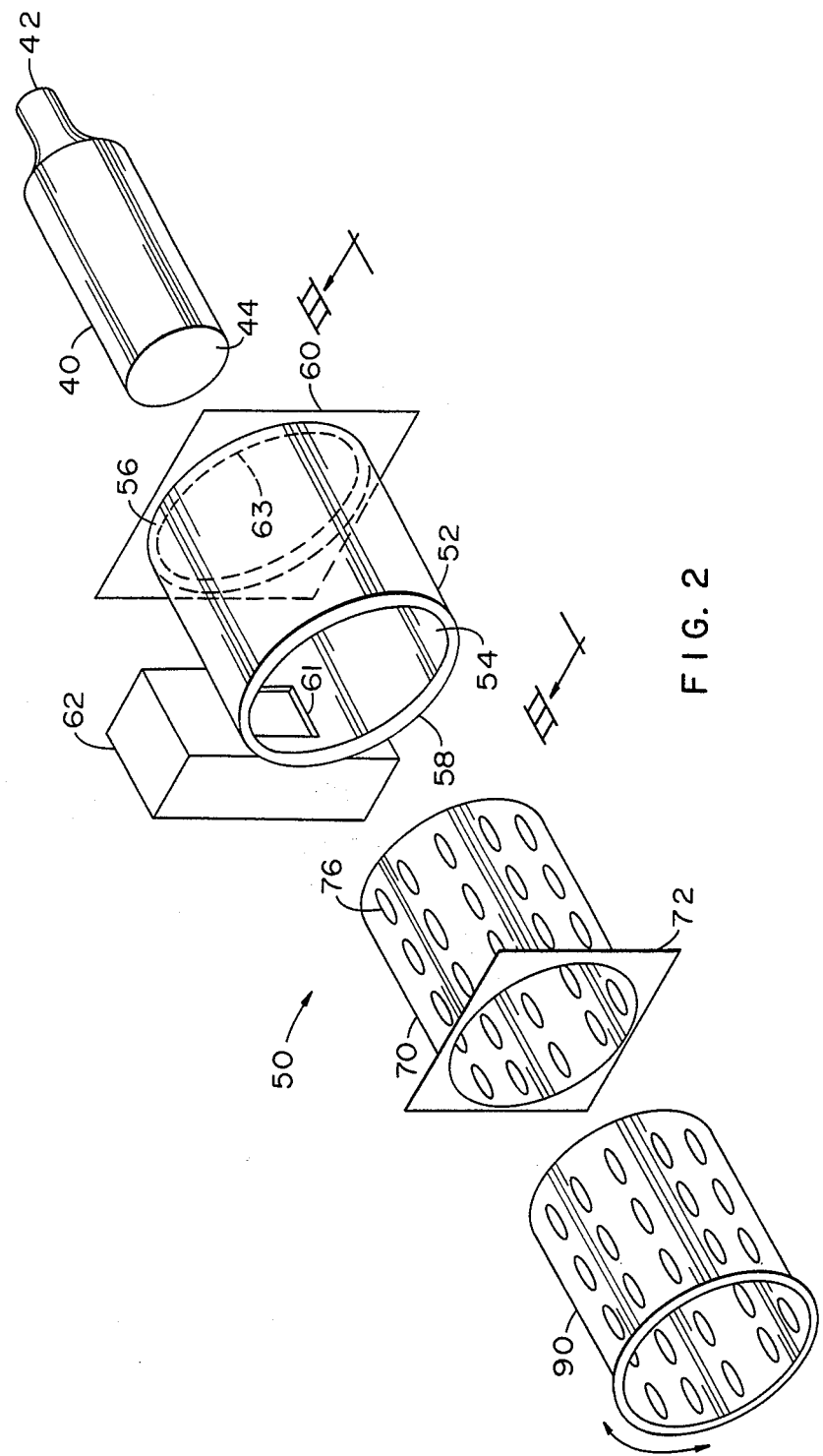
FIG. 2 is an exploded side perspective of a preferred embodiment of the invention.
Figure 3:
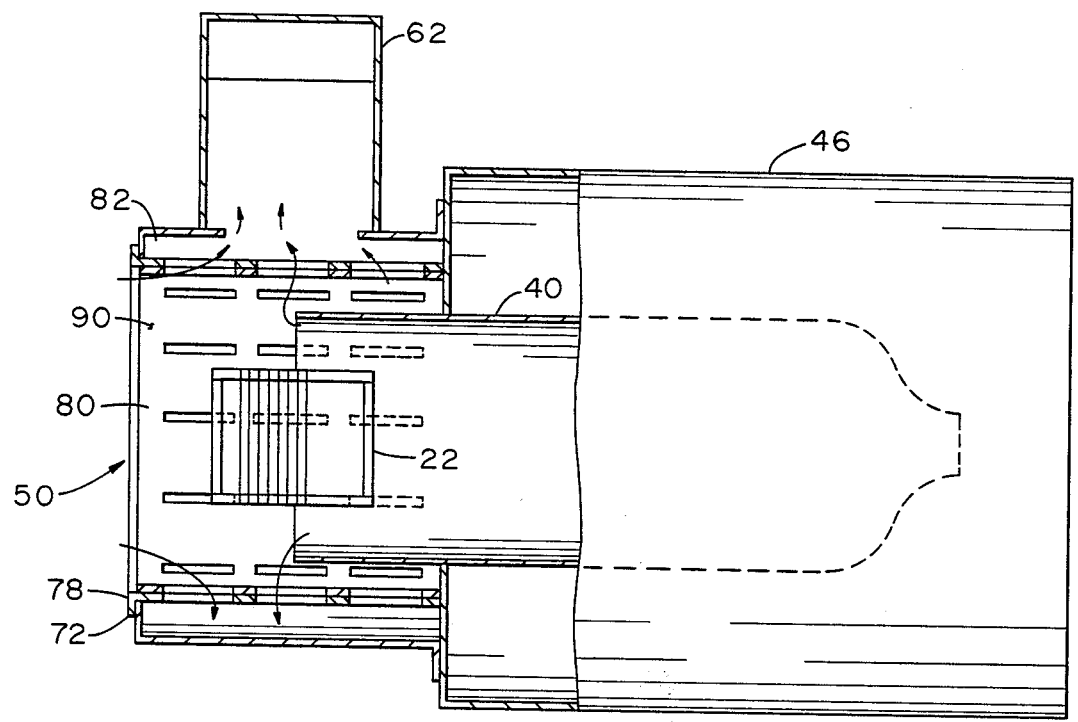
FIG. 3 is an elevational view of the scavenger of FIG. 2 taken along line III—III, shown connected to a furnace.

FIGS. 2 and 3 show the principal structure of an improved gas scavenger intended to be used with a horizontal process tube 40 having a source end 42 and an exhaust end 44. Such a process tube 40 usually is one in a stack of two or four such tubes in a furnace 46.

The scavenger 50 has a peripheral outer wall 52 forming a cylinder having a plenum 54, an inboard end 56 and an outboard end 58. A conventional flange 60 defining the perimeter of a circle 63 aligned with the larger diameter plenum 54 is welded to the outer wall 52 and is conventionally adapted to be fastened to the furnace. The inboard end 56 of the scavenger 50 and the exhaust end 44 of the process tube 40 are then in gas flow communication. As FIG. 3 shows, the exhaust end 44 of the tube 40 may project well into the plenum 54. The outer wall 58 of the scavenger 50 also has an exhaust gas port 61 in gas flow communication with a house exhaust system 62.

The scavenger 50 has an apertured interior wall 70 spaced apart from the outer wall 52 for dividing the plenum into a central chamber 80 through which the wafer ladened boats 22 travel between the process tube 40 and the loading/unloading station (not shown) and a second chamber 82 generally defined by the interior wall 70 and the outer wall 52. A flange 72 defining a circle 78 having a diameter of and aligned with the central chamber 80 may be welded to the outboard end of the interior wall 80. The end plates 60 and 72 preferably enclose the ends of the second chamber 82 so that process gas does not leak into the atmosphere.

Apertures 76 about the inner wall 70 permit gas flow communication between the central chamber 80 and the second chamber 82 in the plenum 54. Preferably, the apertures 76 surround the inner chamber so that the flow path of the gas and air currents are radially outward rather than into the center of the inner chamber or across the wafers 20. The aperture spacing may be closer on the far side from the exhaust port 60 (or the apertures may be larger) in order to balance the flows and pressure drops of the gas and air flow into the second chamber 82.

A damper 90 having an aperture pattern matching the apertures 76 in the interior wall 70 and slidably fitting within the central chamber 80 is rotatably manipulated for adjusting the effective size of the apertures 76. Because the available pressure drop between the air and process tube on one hand and the house exhaust system on the other is relatively constant, the effective size of the apertures 76 should preferably be increased when the process to be run requires a relatively high gas flow rate.

A scavenger such as that shown in FIGS. 2 and 3 generally is preferably constructed of stainless steel sheet metal and electro-polished to a bright finish. The interior wall 70 of such a scavenger may have a diameter of about fifteen inches and the diameter of the outer wall 52 is about sixteen inches.

Figure 4:
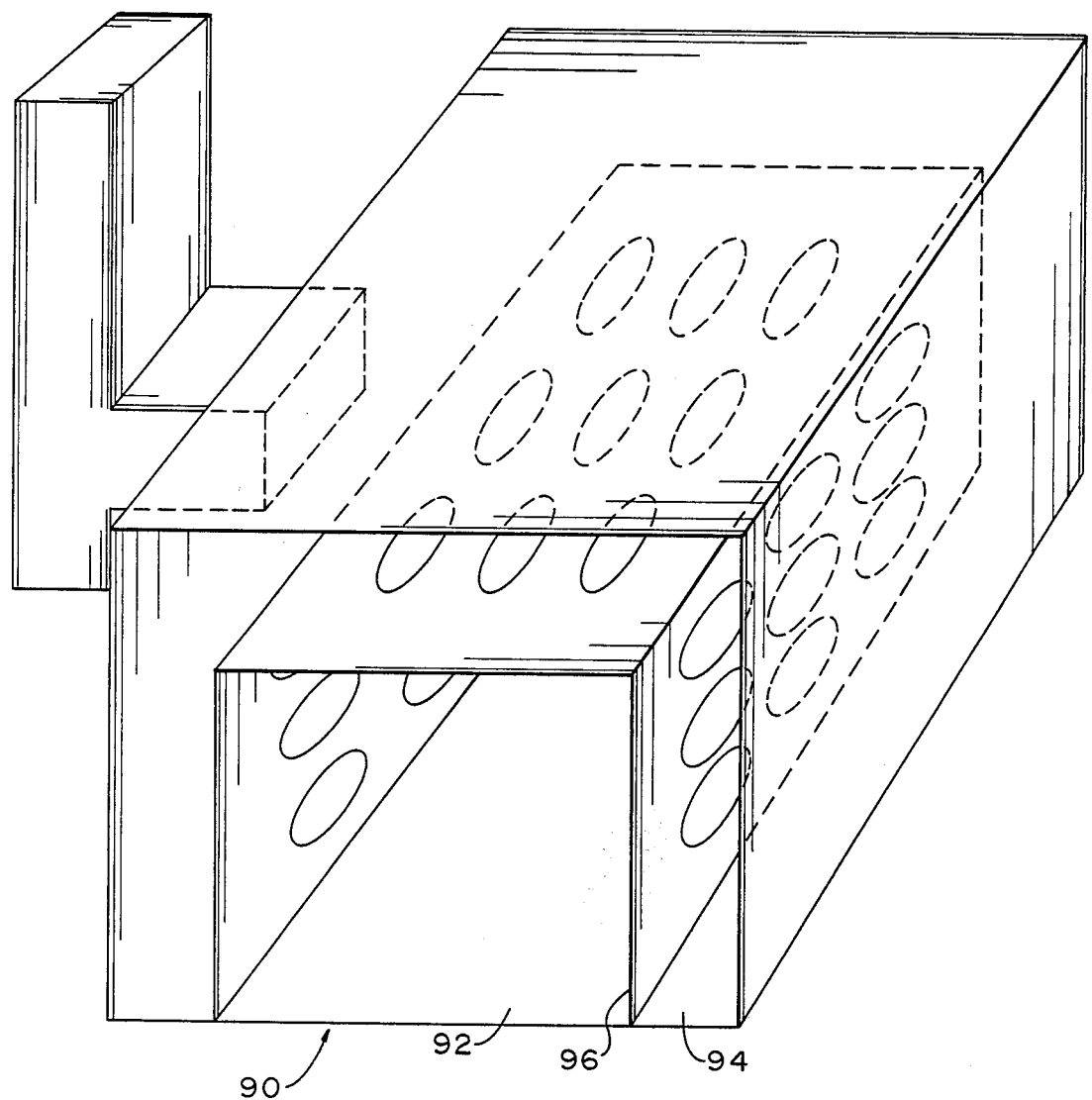
FIG. 4 is a front perspective schematic of a second embodiment of the invention.

A second embodiment of the invention illustrated in FIG. 4 has a rectangular cross section. This scavenger 90 has a central chamber 92 and a second chamber 94 separated by an apertured interior wall 96. Such an embodiment may be used with boats having a semicylindrical shell bottom which generally prevents the gas flowing under the boat from flowing through the wafers in the boat.

While certain preferred embodiments of the invention have been shown and described, it is to be distinctly understood that the invention is not limited thereto but may be otherwise variously embodied within the scope of the following claims.

What is claimed is:

1. A gas scavenger for educting gas away from semiconductor wafers as the wafers are withdrawn from a processing chamber along a path, comprising:
   a peripheral outer wall defining a plenum having opposite ends, the one end in gas flow communication with the processing chamber and the second end in gas flow communication with the atmosphere, the outer wall having a gas exhaust port in gas flow communication with a gas exhaust system, and
   an interior wall dividing the plenum into a first chamber through which the wafers travel and a second chamber in gas flow communication with the gas exhaust port in the outer wall, the interior wall having apertures about the path of wafer travel.

2. The gas scavenger of claim 1 further comprising a damper in operative relation with the apertured interior wall.

3. The gas scavenger of claim 2 wherein the damper is slidable.

4. The gas scavenger of claim 2 wherein the damper is rotatable.

5. The gas scavenger of claim 1 wherein the entire interior wall is spaced apart from the outer wall.

6. The gas scavenger of claim 1 wherein the ends of the second chamber defined by the interior wall and the outer wall are enclosed.

7. The gas scavenger of claim 1 wherein the apertures in the interior wall substantially surround the path of wafer travel.

8. The gas scavenger of claim 1 wherein the total area of the apertures in the interior wall is greater than the cross-sectional area of the end of the first chamber through which the wafers travel.

* * * * *